United States Patent
Hachiya et al.

(10) Patent No.: US 7,092,544 B2
(45) Date of Patent: *Aug. 15, 2006

(54) DIAPHRAGM FOR ELECTROACOUSTIC TRANSDUCER AND METHOD OF MAKING THE SAME

(75) Inventors: Satoshi Hachiya, Tendo (JP); Masatoshi Sato, Tendo (JP)

(73) Assignees: Pioneer Corporation, (JP); Tohoku Pioneer Corp., (JP)

( * ) Notice: Subject to any disclaimer, the term of this patent is extended or adjusted under 35 U.S.C. 154(b) by 444 days.

This patent is subject to a terminal disclaimer.

(21) Appl. No.: 10/163,235

(22) Filed: Jun. 5, 2002

(65) Prior Publication Data

US 2002/0100294 A1 Aug. 1, 2002

(30) Foreign Application Priority Data

Jun. 8, 2001 (JP) .............................. 2001-173742

(51) Int. Cl.
*H04R 25/00* (2006.01)
(52) U.S. Cl. ...................................... 381/426; 381/423
(58) Field of Classification Search ........ 381/423–426, 381/428; 29/594; 181/166–170; 264/45.5, 264/51

See application file for complete search history.

(56) References Cited

U.S. PATENT DOCUMENTS

| 5,259,036 | A | * | 11/1993 | Seeler ......................... 381/426 |
| 6,030,561 | A | * | 2/2000 | Sato et al. ..................... 264/51 |
| 6,377,695 | B1 | * | 4/2002 | Azima et al. ............... 381/426 |
| 6,453,049 | B1 | * | 9/2002 | Chu et al. .................... 381/426 |

FOREIGN PATENT DOCUMENTS

| JP | 08-340594 | 12/1996 |
| JP | 11-275687 | 10/1999 |

* cited by examiner

*Primary Examiner*—Suhan Ni
(74) *Attorney, Agent, or Firm*—Perman & Green, LLP.

(57) ABSTRACT

A molten resin is injected into a cavity together with long fibers. Opposite surfaces of the resin are solidified as a fiber-resin mixture temperature drops. These surface layers become non-foam layers. A foam layer is created between the non-foam layers. A pressure reduction process is applied to cause a spring back effect when the foam layer is created. A diaphragm having these three layers can be manufactured in an inexpensive process, but physical characteristics and appearances of the diaphragm are not sacrificed.

7 Claims, 4 Drawing Sheets

AFTER FOAMING

BEFORE FOAMING

AFTER FOAMING

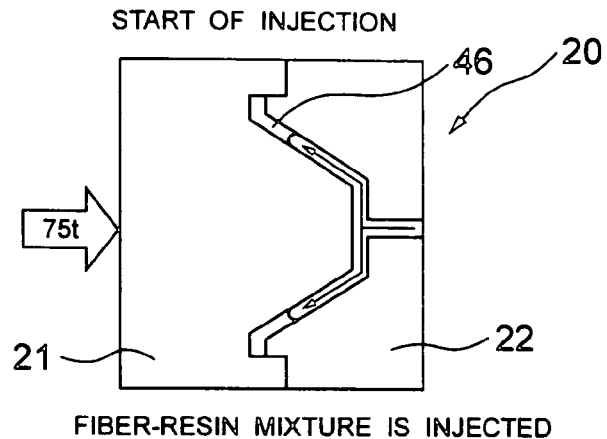
FIG. 3A — START OF INJECTION / FIBER-RESIN MIXTURE IS INJECTED
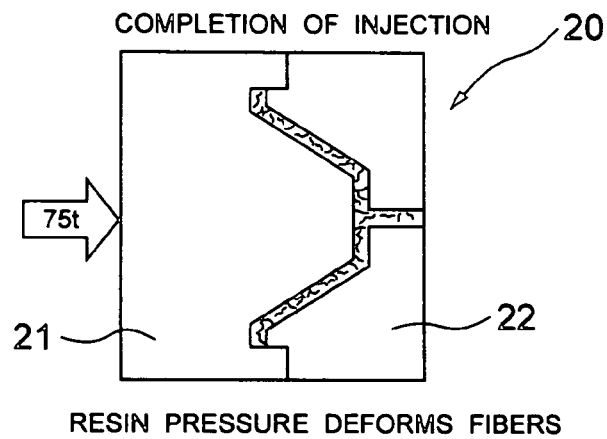
FIG. 3B — COMPLETION OF INJECTION / RESIN PRESSURE DEFORMS FIBERS
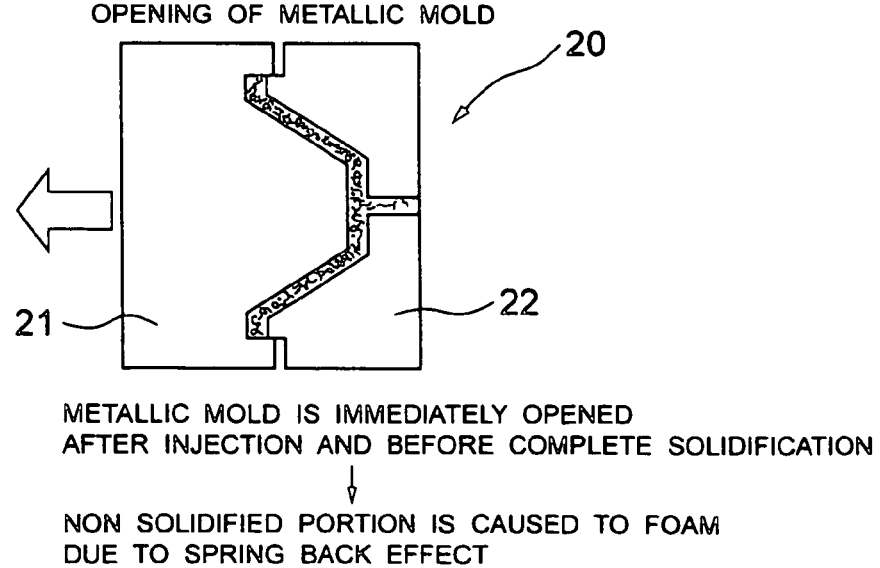
FIG. 3C — OPENING OF METALLIC MOLD
METALLIC MOLD IS IMMEDIATELY OPENED AFTER INJECTION AND BEFORE COMPLETE SOLIDIFICATION
↓
NON SOLIDIFIED PORTION IS CAUSED TO FOAM DUE TO SPRING BACK EFFECT

DIAPHRAGM FOR ELECTROACOUSTIC TRANSDUCER AND METHOD OF MAKING THE SAME

BACKGROUND OF THE INVENTION

1. Field of the Invention

The present invention relates to a diaphragm used in an electroacoustic transducer such as a speaker, and also relates to a method of fabricating such diaphragm.

2. Description of the Related Art

In general, a material for a diaphragm has to have a small density, large Young's modulus (high rigidity) and appropriate internal loss. Further, the diaphragm material needs to possess a sufficient resistance to the environment.

A typical-material for a conventional diaphragm is PP (polypropylene) which has an adequate environmental resistance (particularly, water resistance) and large internal loss. Another known material for the diaphragm is a liquid crystal polymer which has high rigidity.

One type of diaphragms has a honeycomb structure to increase rigidity and reduce weight. Another type of diaphragms has a three-layer structure that includes a foam and planar skin layers, which sandwich the foam. Among the conventional diaphragms, the polypropylene diaphragm has a greater specific weight than paper and a relatively small Young's modulus. The liquid crystal polymer diaphragm has a relatively large specific weight and a smaller internal loss than polypropylene. No conventional materials meet all of the above mentioned requirements for the diaphragm.

Under these circumstances, it is ideal that the structure of the diaphragm be modified to meet the physical requirements such as density and Young's modulus, and the material of the diaphragm be selected to meet other requirements. In reality, however, if the diaphragm has to have a three-layer structure, a manufacturing process must include a step of bonding the three layers. This results in an increase of the manufacturing cost.

To deal with the above described problems, the present assignee proposed a speaker diaphragm which has a three-layer structure in Japanese Patent Kokai No. 8-340594. Surface layers of this three-layer structure are non-foamed layers, and the inside layer is the foam. This three-layer structure is fabricated by an injection molding process using resin together with a foaming agent. The present assignee also proposed another speaker diaphragm having a three-layer structure prepared by another injection molding process in Japanese Patent Kokai No. 11-275687. The injection molding process uses resin, which is compounded with a filler of inorganic matters or organic matters, together with a foaming agent. The resulting three-layer structure has an inner foam layer and outer (surface) non-foam layers. These injection molding processes can improve the physical characteristics of the diaphragm without increasing the manufacturing cost. The resulting speaker diaphragm is lightweight, and has large internal loss, high rigidity and high environmental resistance.

However, if the three-layer structure is created from the resin with the foaming agent, the resulting product (diaphragm) suffers from certain deterioration. Specifically, the rigidity of the product is lowered by a heterogeneous material (e.g., polyethylene) used to prevent the foaming agent from dispersing. Further, gases derived from the foaming agent would degrade the appearance of the product. In addition, some limitations are imposed on the resin molding process due to a decomposition (dissolution) temperature of the foaming agent.

SUMMARY OF THE INVENTION

An object of the present invention is to provide a diaphragm having a three-layer structure, which does not have the above described problems.

Another object of the present invention is to provide a method of manufacturing such diaphragm.

According to one aspect of the present invention, there is provided a diaphragm comprising a three-layer structure, wherein the three-layer structure includes a pair of non-foam layers and a foam layer sandwiched by the non-foam layers, and the three-layer structure is created by injecting a fiber-resin mixture into a cavity of a mold, and cooling the fiber-resin mixture while reducing a pressure on the fiber-resin mixture. The fiber-resin mixture includes a thermoplastic resin and fibers dispersed in the thermoplastic resin.

According to another aspect of the present invention, there is provided a method of manufacturing a diaphragm comprising the steps of: mixing and melting a thermoplastic resin with fibers to obtain a molten resin-fiber mixture; filling the molten resin-fiber mixture into a low temperature cavity of a mold; and expanding a volume of the cavity to create a three-layer structure from the resin-fiber mixture, which includes an inner foam layer and a pair of outer non-foam layers sandwiching the inner foam layer.

The foam layer is formed using a spring back effect of the fibers. Therefore, the three-layer structure which has the inner foam layer and the sandwiching outer non-foam layers is created without using a foaming agent. The diaphragm having the three-layer structure is lightweight and has high rigidity. Further, the fibers twine three-dimensionally so that the rigidity of the surface layers becomes close to the rigidity of the inner layer, and the rigidity of the material in the resin flow direction during the injection molding process becomes close to the rigidity of the material in the direction perpendicular to the resin flow direction. The diaphragm has a great environmental resistance. Further, it is unnecessary to adhere the three layers with each other, unlike the conventional process. Since no foaming agent is used, no foaming gas is generated or trapped in the surface of the diaphragm, and therefore the appearance of the diaphragm is not deteriorated. Desired physical characteristics can be obtained when an average fiber length is no shorter than 1 mm and a foaming expansion rate is greater than 1 but no greater than 3.0.

BRIEF DESCRIPTION OF THE DRAWINGS

FIGS. 3A through 3C illustrate a series of operations of the speaker diaphragm manufacturing method in a chronological order, specifically FIG. 3A illustrates when a fiber-resin mixture is injected into a mold cavity, FIG. 3B illustrates when the injection is complete, and FIG. 3C illustrates when the mold is opened.

DETAILED DESCRIPTION OF THE INVENTION

Figure 1A:
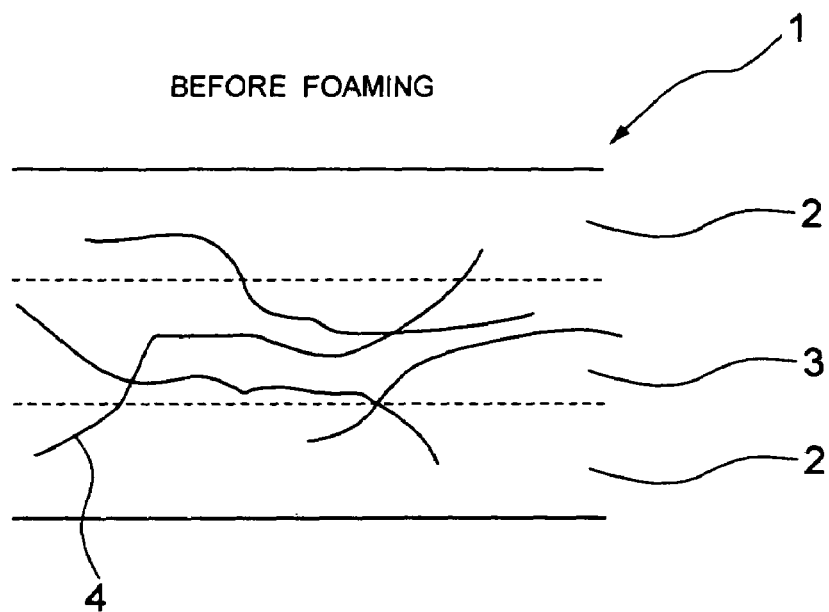
FIG. 1A schematically illustrates a cross sectional view of a diaphragm according to one embodiment of the present invention before foaming.
Figure 1B:
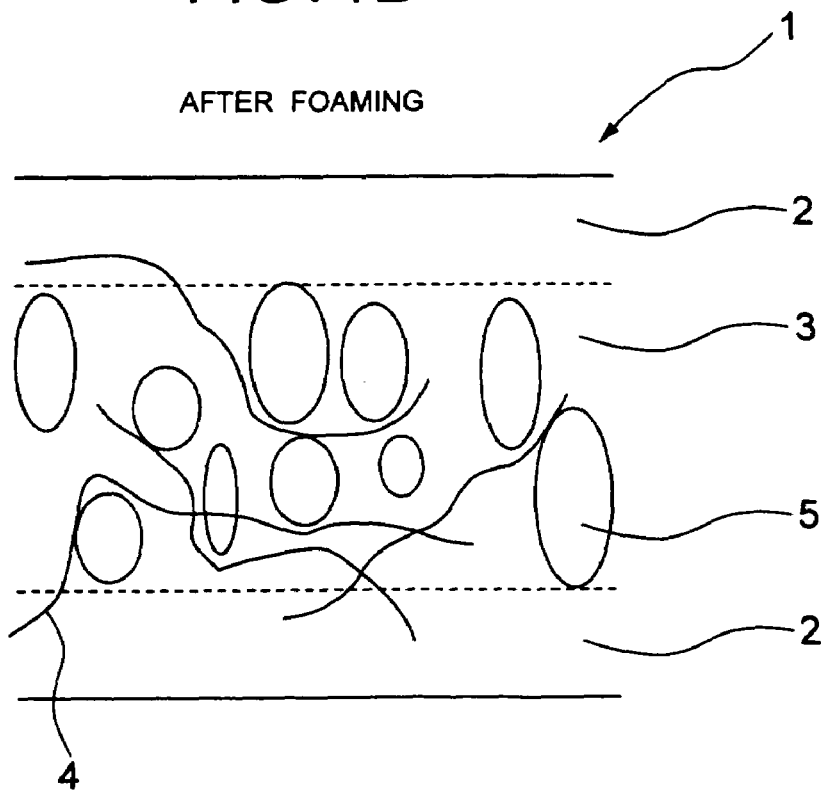
FIG. 1B schematically illustrates a cross sectional view of the diaphragm after foaming.

Embodiments of the present invention will be described in reference to the accompanying drawings. A diaphragm for a speaker will be described as an example of a diaphragm for an electroacoustic transducer according to the present invention. Referring to FIGS. 1A and 1B, a speaker diaphragm 1 has an inner foam layer 3 and opposite surface layers 2. The inner foam layer 3 is produced by the following process: (1) injecting a thermoplastic resin mixture, in a molten state, into a cavity of a metallic mold, wherein the thermoplastic resin mixture includes fibers having relatively high rigidity; and (2) retracting a half of the metallic mold immediately after the step (1) to reduce the pressure inside the cavity, thereby causing a foaming phenomenon in the resin mixture due to a spring back effect of the fibers. Since outer surfaces of the foam layer contact the inner wall of the metallic mold (i.e., cavity wall) while the resin is injected into the metallic mold, the outer surfaces of the foam layer are solidified before the half of the metallic mold is retracted, whereby the non-foam surface layers 2 are created to sandwich the inner foam layer 3.

The spring back effect is a phenomenon caused during a period from the resin injection to the mold half retraction. In this period, residual stresses of the deformed fibers are released so that the fibers return to original shapes. As a result, a gas space is formed around elongated fibers, and those portions of the resin mixture which do not contact the metallic mold inflate (expand).

Preferably, an average length of the fibers is no less than 1 mm. It should be noted that a certain filler used with a foaming agent in Japanese Patent Kokai No. 8-340594 is fibers. In the prior art, however, the fibers are added to the resin to improve physical characteristics and appearance of the product. The fibers are not added to cause the spring back effect. In the prior art, it is also true that the fiber length is less than 1 mm. Therefore, no spring back effect can be expected. The present inventors have noticed the spring back effect of the fibers. If the fiber length is shorter than 1 mm, the foaming phenomenon due to the spring back effect will not result, and sufficient twisting (twining) does not take place among the fibers. Accordingly, the product does not have decent rigidity.

In this embodiment, the fibers may be inorganic fibers (e.g., boron fibers, silicon carbide fibers, alumina fibers, silicon nitride fibers, zirconia fibers, glass fibers, carbon fibers, copper fibers, brass fibers, steel fibers, stainless fibers, aluminum fibers, or aluminum alloy fibers), or organic fibers (e.g., polyester fibers, polyamide fibers or polyarylate fibers). It should be noted that the organic and inorganic fibers may be mixed with each other. In particular, it is most preferred to use rigid fibers such as aromatic polyester fibers and aromatic polyimide fibers. Rigid and long fibers to be used for the speaker diaphragm should have a greater rigidity than a thermoplastic resin.

Preferably, the glass fibers are E-glass or S-glass fibers, with an average fiber diameter being 50 microns or less, preferably 3 to 30 microns. If the glass fiber diameter is not less than 3 microns, the glass fibers combine with the resin in a pellet preparation process in a preferred manner, and impregnation of the resin proceeds in a preferred manner. On the other hand, if the glass fiber diameter is not greater than 30 microns, all the fibers sufficiently break during melting and/or mixing. When the above-described thermoplastic resin and glass fibers are utilized to prepare pellets by a drawing process or the like, the glass fibers may be surface-treated with a coupling agent.

Preferably, the thermoplastic resin used for the speaker diaphragm is polypropylene. For example, one of the following olefin resins may be used; propylene-ethylene block copolymer, propylene-ethylene random copolymer, or polyethylene. Alternatively, one of the following polystyrene resin may be used; polystyrene, rubber-degenerated (-denatured) impact-resistive polystyrene, or polystyrene including a syndyotactic structure. Alternatively, an ABS resin, polyvinyl chloride resin, polyamide resin, polyester resin, polyacetal resin, polycarbonate resin, polyaromatic ether or thioether resin, polyaromatic ester resin, polysulfone resin, or acrylate resin. The above-mentioned thermoplastic resins may be used individually or collectively (mixedly).

Among these thermoplastic resins, is preferred a polypropylene resin, such as a block copolymer of polypropylene/propylene and other olefin, a random copolymer of the same, or their mixture. It is also preferred that the polypropylene resin includes non-saturated carboxylic acid such as maleic anhydride and fumaric acid, or acid-degenerated polyolefin resin (i.e., resin degenerated with a derivative of the non-saturated carboxylic acid). One or more other thermoplastic resins may be added to the polypropylene resin. Such additional thermoplastic resin is, for example, high density polyethylene, low density polyethylene, ethylene-$\alpha$-olefin copolymer resin, or polyamide resin. Other substances may also be added to the polypropylene resin. For instance, an elastomer to improve an impact resistance, such as ethylene-$\alpha$-olefin copolymer elastomer, may be added. An oxidization preventing agent which includes phenol, phosphorus, or sulfur may be added. A light stabilizing agent, ultraviolet ray absorber, environment-proof agent, bridging agent, core making agent, and coloring agent may be added. A filler such as short fibers, talc, and calcium carbonate may be added.

Figure 2:
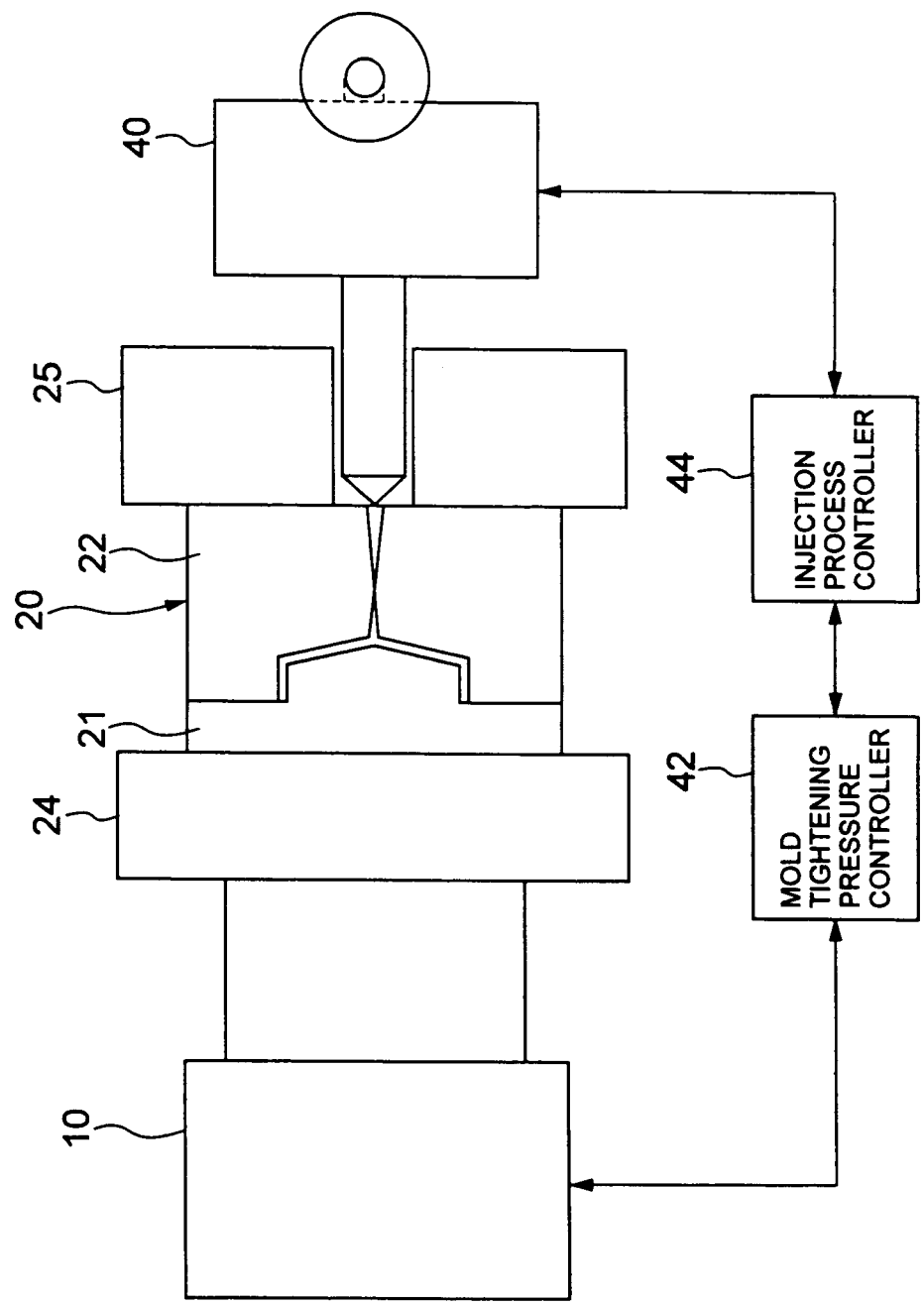
FIG. 2 illustrates a block diagram of an injection molding machine to carry out a speaker diaphragm manufacturing method according to one embodiment of the present invention.

FIG. 2 illustrates an injection molding machine for fabricating the speaker diaphragm 1 shown in FIGS. 1A and 1B.

In this drawing, a movable platen 24 of the metallic mold 20 of the injection molding machine supports a movable mold 21. A stationary platen 25 of the metallic mold 20 supports a stationary mold 22. A tightening (fastening) pressure acting (exerted) between the movable mold 21 and stationary mold 22 is regulated (controlled, adjusted) by a mold tightening cylinder 10, which is actuated under the control of a metallic mold tightening pressure controller 42.

An injection jet of an injection machine 40 is inserted in an injection hole of the fixed mold 22 to injection a fiber-resin material (fiber-resin mixture). The fibers having certain rigidity are added to a thermoplastic resin to prepare the fiber-resin material. The injection machine 40 is regulated (controlled) on the basis of injection conditions determined (adjusted) by an injection process controller 44. The injection machine 40 outputs information about the molding process. The mold tightening pressure controller 42 controls the tightening pressure between the two molds 21 and 22 in accordance with the information supplied from the injection machine 40, a position (or moving distance) of the movable platen 24, and the like.

Now, a diaphragm manufacturing method using the molding machine shown in FIG. 2 will be described.

Referring to FIG. 3A, the mold tightening cylinder 10 first closes the movable mold 21 and stationary mold 22 of the mold assembly 20. The injection machine 40 then injects the fiber-resin mixture into the cavity 46 of the mold assembly 20.

The temperature of the fiber-resin mixture in the cylinder 10 is maintained to be higher than a melting point of the thermoplastic resin. For instance, if polypropylene is used, the temperature of the fiber-resin mixture is maintained to 220° C. The wall temperature of the cavity 46 is maintained to be lower than the melting point of the thermoplastic resin. For instance, if polypropylene is used, the cavity wall temperature is maintained to approximately 80° C. The mold tightening pressure exerted by the cylinder 10 under the control of the tightening pressure controller 42 is maintained to approximately 200 tons. A general thickness of the cavity 46 defined between the movable mold 21 and fixed mold 22 is about 0.3 mm.

Referring to FIG. 3B, the fiber-resin mixture filled in the cavity 46 between the movable mold 21 and fixed mold 22 starts solidifying from those portions which contact the inner walls of the molds 21 and 22 (i.e., cavity wall), thereby forming non-foam surface layers 2. The fibers of the fiber-resin mixture which are present in the molten portion is subject to an push-out pressure exerted from a screw (of the molding machine 40) and the tightening pressure exerted between the engaged molds 21 and 22. Accordingly, the fibers are caused to have a shape different from a shape in an ordinary pressure condition.

Referring to FIG. 3C, immediately after the filling in (or injection) of the fiber-resin mixture is complete, the mold tightening pressure exerted by the cylinder 10 is released instantaneously to effect a core back movement. The releasing of the mold tightening pressure is performed while the rigid fibers in the molten state can develop (exert) a shape recovering (restoration) force to expand (inflate) an inside material and push the surrounding non-foam layers 2. This causes the spring back effect so that the fibers in the molten state expands while pushing the surrounding resin. This makes an inner foam layer 3.

Now, the timing of opening the mold assembly 20, i.e., when the movable mold 21 should be retracted or separated from the fixed mold 22, will be described. If the movable mold 21 is retracted before the rein injection is not complete, the fiber-resin mixture is excessively concentrated (i.e., too many fiber-resin mixture is introduced) in the cavity 46 between the movable mold 21 and fixed mold 22, and therefore the weight of the product becomes too heavy. On the other hand, if the retraction movement of the movable mold 21 is carried out too late, the resin is solidified excessively and the solidification is complete before the fibers demonstrate the spring back effect. In this particular embodiment, the movable mold 21 is preferably retracted about 0.2 to 0.3 seconds after the initiation of the injection. It should be noted, however, that the timing for retracting the movable mold 21 should be determined on the basis of a temperature of the fiber-resin mixture, a temperature of the mold 20, the thickness of the product, an amount of fibers included in the fiber-resin mixture and/or other factors.

An amount of retracting movement of the movable mold 21 is about 0.1 to 1.5 mm. This retracting movement should be performed within a period of 0.04 to 0.05 second (high speed retracting movement) when a non-thin, foam-molded diaphragm is fabricated. Therefore, the movable mold 21 is moved at a speed of about 0.0020 to 0.0375 mm/ms. In an actual application, the speed and amount of the retracting movement of the movable mold 21 are determined (adjusted) in accordance with the type and amount of the fibers added to the thermoplastic fiber. When a thin, foam-molded diaphragm is fabricated, the movable mold 21 is retracted at a speed of about 0.001 mm/ms or more.

The spring back effect is enhanced when the fibers have high rigidity. Such high rigidity fibers are, for example, carbon fibers and glass fibers. Use of such fibers results in increased foaming expansion rate.

Some experimental results will be shown below. Glass fiber-reinforced polypropylene, available from Daicel Chemical Industries, Ltd. of Osaka, Japan, was used. An amount of additive (fibers) was 25 wt %. An injection molding machine was Ultra 220 of Sumitomo Heavy Industries, Ltd. of Tokyo, Japan.

Figure 4:
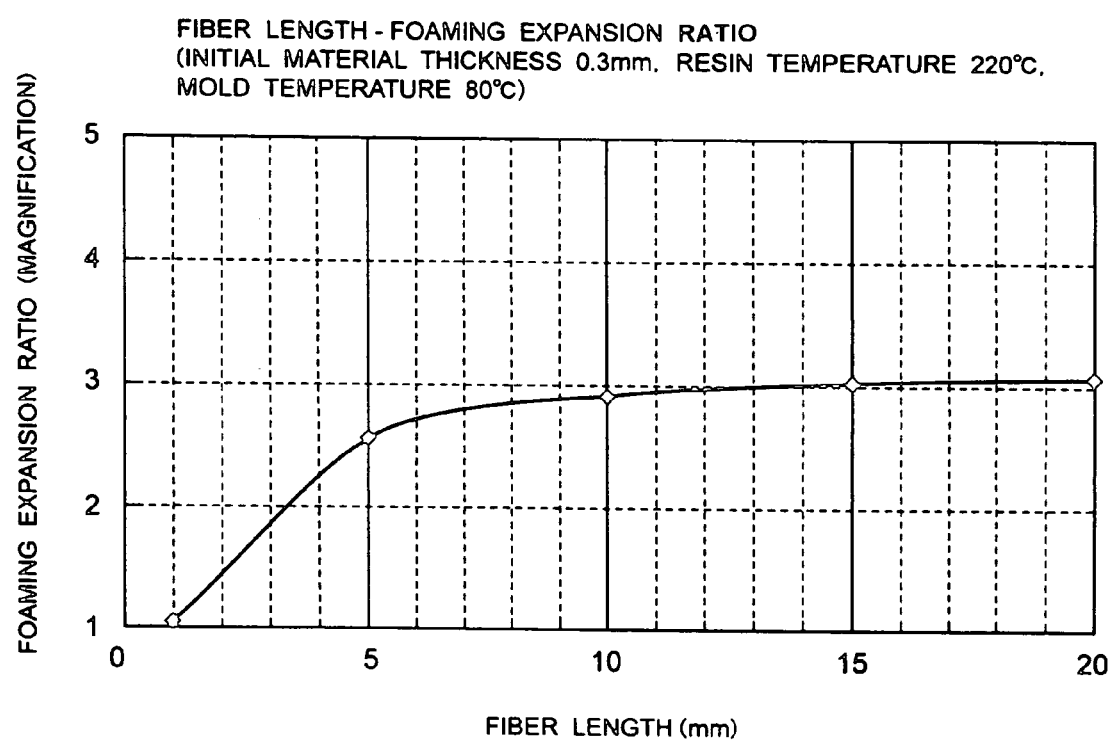
FIG. 4 illustrates a graph showing relationship between fiber length and foaming expansion rate of the speaker diaphragm.

Foaming expansion (expansion upon foaming) of the product obtained by the above mentioned material and machine changed with the fiber length as shown in FIG. 4, when an initial material thickness was 0.3 mm, the fiber-resin mixture temperature was 220%, and the mold temperature was 80%. Table I indicates five products made by the experiments with different foaming expansion rates (magnification), and one typical product available in the market. These six products are compared with each other in terms of Young's modulus, specific weight, internal loss and rigidity ratio.

TABLE I

| Foaming Expansion Rate | 1.0 | 1.5 | 2.0 | 2.5 | 3.0 | Typical Product |
|---|---|---|---|---|---|---|
| Young's Modulus | 5.80E+09 | 6.41E+09 | 6.90E+09 | 6.92E+09 | 6.95E+09 | 6.40E+09 |
| Specific Weight | 1.08 | 0.72 | 0.54 | 0.43 | 0.36 | 1.08 |
| Internal Loss | 0.062 | 0.068 | 0.069 | 0.071 | 0.073 | 0.066 |
| Rigidity Ratio | 0.91 | 1.00 | 1.08 | 1.08 | 1.08 | 1.00 |

Rigidity ratio of the typical product is set to be 1.

As understood from FIG. 4, the foaming expansion rate increases when the fiber length is longer than 1 mm. The foaming expansion rate rises with the fiber length. It is considered that foaming is obtained by the spring back effect when the fiber length is longer than 1 mm.

It is understood from Table I that the internal loss increases with the foaming expansion rate, and the rigidity also increases with the foaming expansion rate.

Once the foaming expansion rate exceeds about 3.0, however, the foam cell becomes too large, and uniform foaming does not result. This creates irregularities in physical characteristics of the products (speaker diaphragms). Accordingly, the foaming expansion rate is preferably between 1 and 3.0.

When the foaming expansion rate is more than 1.5, the foam cells in the inner foam layer 3 are directed (arranged, aligned, elongated) in a longitudinal direction relative to the layer thickness direction. This reinforces the surface non-foam layers 2. As a result, the drop of the Young's modulus becomes gentle, and the rigidity increases steeply. This is partly relied upon a fact that the mold is retracted at a high speed to effect the foam molding.

On the other hand, when the foaming expansion ratio is greater than 2.5, the resin density of the inner foam layer 3 becomes too small. Therefore, the reinforcement of the surface non-foam layers 2 by the foam layer 3 cannot be expected very much. Accordingly, the drop of the Young's modulus becomes significant, and the irregularities in rigidity of the products become larger. In order to efficiently increase the structural rigidity with to the foam structure and obtain the products having uniform qualities, the preferred range of the foaming expansion rate is considered to be between about 1.5 and 2.5.

In order to obtain the lightweight and highly rigid three-layer structure, which includes the inner foam layer 3 and the sandwiching non-foam layers 2, it is desired to make the three-layer structure as thin as possible, while ensuring the intensity of the surface non-foam layers 2. However, when the three-layer structure having thin surface layers 2 is fabricated by the injection foam molding, the surface layers 2 sometimes deform and/or crack upon foaming when the movable mold 21 is retracted. In short, if the surface layer 2 is too thin, the three-layer structure cannot have sufficient strength.

On the other hand, when the surface layers 2 are too thick, an amount of resin used to foam the inner layer 3 becomes insufficient. Therefore, desirable foaming expansion cannot be expected, i.e., the foaming expansion rate drops. In view of these, the most preferred thickness of the surface non-foam layer 2 of the three-layer structure is about one-third the material thickness of before the foaming.

In this embodiment, the resin mixed with the rigid fibers undergoes the injection molding process to obtain the three-layer structure, which includes the inner foam layer 2 and the outer non-foam layers 3 sandwiching the inner foam layer, so that the structure (product) can have a large thickness with a low specific weight. Consequently, the resulting diaphragm is lightweight and has high rigidity on one hand, and has a significant environmental resistance because the surfaces are the non-foam layers 2 on the other hand. Furthermore, there is no need to bond (glue, adhere) the three layers, unlike the conventional three-layer structure diaphragm. In addition, a conventional molding machine can be utilized. These contribute to a reduction of the manufacturing cost of the diaphragm.

Further, since no foaming agent is used, foaming gases (e.g., nitrogen, carbon dioxide, etc.) are not produced. In other words, these gases are not trapped (confined) in the surface of the product, and therefore the appearance of the product (diaphragm) is not deteriorated. This also eliminates the limitations imposed on the resin and molding conditions due to use of the foaming agent. Further, the fibers twine (twist) three-dimensionally so that the rigidity of the surface layers 3 becomes close to the rigidity of the inner layer 2, and the rigidity of the material in the resin flow direction of during the injection molding process becomes close to the rigidity of the material in the direction perpendicular to the resin flow direction. Desired physical characteristics can be obtained when the average fiber length is greater than 1 mm and the foaming expansion rate is between 1 and 3.0.

As understood from the foregoing description, the diaphragm having the three-layer structure can be made without a foaming agent. A small amount of filler added to the diaphragm ensures sufficient rigidity and suppresses a reduction in the internal loss.

Further, since no foaming agent is utilized, no foaming gas is not trapped in the surface layers of the diaphragm. Therefore, the appearance of the diaphragm is not adversely influenced by the trapped foaming gas, which is otherwise created.

This application is based on Japanese patent application No. 2001-173742, and the entire disclosure thereof is incorporated herein by reference.

What is claimed is:

1. A diaphragm comprising a three-layer structure, wherein the three-layer structure includes a pair of non-foam layers and a foam layer sandwiched by the pair of non-foam layers, and the three-layer structure is created by injecting a fiber-resin mixture into a cavity of a mold, and cooling the fiber-resin mixture while reducing a pressure on the fiber-resin mixture, the fiber-resin mixture including a thermoplastic resin and expandable fibers dispersed in the thermoplastic resin.

2. The diaphragm according to claim 1, wherein rigidity of the fibers is greater than rigidity of the thermoplastic resin.

3. The diaphragm according to claim 1, wherein an average length of the fibers is no shorter than 1 mm.

4. The diaphragm according to claim 1, wherein an average foaming expansion rate of the overall diaphragm, including the pair of non-foam layers, is greater than 1 but no greater than 3.0.

5. The diaphragm according to claim 1, wherein the diaphragm is a speaker diaphragm.

6. The diaphragm according to claim 1, wherein the fibers have a length sufficient to cause a spring back effect when the pressure on the fiber-resin mixture is reduced.

7. The diaphragm according to claim 1, wherein the fibers have a length sufficient to cause twining of the fibers.

* * * * *